(12) United States Patent
Chen

(10) Patent No.: US 11,393,890 B2
(45) Date of Patent: Jul. 19, 2022

(54) ACTIVE MATRIX ORGANIC LIGHT-EMITTING DIODE DISPLAY PANEL WITH COMPENSATION CAPACITOR

(71) Applicant: WUHAN CHINA STAR OPTOELECTRONICS SEMICONDUCTOR DISPLAY TECHNOLOGY CO., LTD., Hubei (CN)

(72) Inventor: Tao Chen, Hubei (CN)

(73) Assignee: WUHAN CHINA OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 228 days.

(21) Appl. No.: 16/770,831

(22) PCT Filed: Mar. 18, 2020

(86) PCT No.: PCT/CN2020/079895
§ 371 (c)(1),
(2) Date: Jun. 8, 2020

(87) PCT Pub. No.: WO2021/139003
PCT Pub. Date: Jul. 15, 2021

(65) Prior Publication Data
US 2021/0217838 A1      Jul. 15, 2021

(30) Foreign Application Priority Data

Jan. 9, 2020   (CN) .......................... 202010021746.6

(51) Int. Cl.
*H01L 27/32* (2006.01)

(52) U.S. Cl.
CPC ................................ *H01L 27/3276* (2013.01)

(58) Field of Classification Search
CPC .................................................. H01L 27/3276
See application file for complete search history.

(56) References Cited

U.S. PATENT DOCUMENTS

| 8,576,154 B2 | 11/2013 | Kim |
| 2015/0008395 A1 | 1/2015 | Yoon et al. |
| (Continued) | | |

FOREIGN PATENT DOCUMENTS

| CN | 107611142 A | 1/2018 |
| CN | 108538907 A | 9/2018 |
| (Continued) | | |

*Primary Examiner* — Lex H Malsawma
(74) *Attorney, Agent, or Firm* — The Roy Gross Law Firm, LLC; Roy Gross

(57) ABSTRACT

The present invention provides an active matrix organic light emitting diode display panel including a display area with a recessed space and a concave area, wherein the concave area is connected to the display area and is disposed close to the recessed space, and the concave area is provided with an RC compensation capacitor therein, which is formed by voltage lines and a scanning lines. The active matrix organic light-emitting diode display panel provided by the present invention can reduce the phenomenon of screen-splitting between the concave area and the display area on the premise of ensuring a narrow upper frame.

16 Claims, 3 Drawing Sheets

(56) References Cited

U.S. PATENT DOCUMENTS

| | | | |
|---|---|---|---|
| 2018/0107084 A1 | 4/2018 | Hirata | |
| 2018/0129106 A1* | 5/2018 | Gao | G09G 3/3648 |
| 2019/0019789 A1* | 1/2019 | Kim | H01L 27/3276 |
| 2019/0157630 A1* | 5/2019 | Kwon | H01L 27/1214 |
| 2019/0181213 A1* | 6/2019 | Lim | G09G 3/3225 |
| 2019/0392767 A1* | 12/2019 | Kim | H01L 51/0096 |
| 2020/0044008 A1* | 2/2020 | Lee | H01L 27/3265 |
| 2020/0286975 A1* | 9/2020 | Na | H01L 27/323 |

FOREIGN PATENT DOCUMENTS

| | | |
|---|---|---|
| CN | 109116644 A | 1/2019 |
| CN | 110610675 A | 12/2019 |
| CN | 209843713 U | 12/2019 |

\* cited by examiner

ACTIVE MATRIX ORGANIC LIGHT-EMITTING DIODE DISPLAY PANEL WITH COMPENSATION CAPACITOR

BACKGROUND OF INVENTION

Field of Invention

The present invention relates to a field of display technology, and in particular, to a notch active matrix organic light-emitting diode display panel capable of realizing a design of a narrow upper bezel.

Description of Prior Art

A design of a notch active matrix organic light-emitting diode display panel is a design scheme to increase a screen-to-body ratio of a mobile phone terminal. Generally, a concave cut design is used at an upper bezel of the active matrix organic light-emitting diode display panel for placement of a camera and other sensing devices. The design of the concave active matrix organic light-emitting diode display panel is characterized by a large difference in a number of pixels between different rows of the concave area, especially the difference between the two rows of pixels at the boundary between the concave area and the display area, which eventually results in a significant difference in brightness between the two rows, and a phenomenon of split-screen between the concave area and the display area on the display.

In order to solve the above-mentioned phenomenon of split-screen between the concave area and the display area, a common solution in the prior art is to employ an RC compensation design on the scan lines of the concave area, that is, to add an RC compensation unit to each of the rows to reduce a load difference of the scan lines between two adjacent rows, thereby reducing phenomenon of split-screen and improving display uniformity.

However, since the RC compensation unit is generally placed on the upper bezel of the panel, due to the large number of the compensation units, it is difficult to achieve a narrow upper bezel, so that the design of the narrow upper bezel of the active matrix organic light-emitting diode display panel cannot be realized.

Therefore, in view of the defect that the active matrix organic light-emitting diode display panel of the prior art cannot reduce the phenomenon of split-screen between the concave area and the display area on the premise of ensuring a narrow upper bezel, there is a need to provide a new active matrix organic light-emitting diode display panel that can reduce the phenomenon of split-screen between the concave area and the display area and realize a narrow upper bezel to solve the above problems.

The existing active matrix organic light-emitting diode display panel cannot reduce the defect of the phenomenon of split-screen between the concave area and the display area on the premise of ensuring a narrow upper bezel.

SUMMARY OF INVENTION

The present invention provides an active matrix organic light-emitting diode display panel, including a display area having a recessed space and a concave area, wherein the concave area is connected to the display area and disposed to close to the recessed space, the concave area is provided with an RC compensation capacitor, and the active matrix organic light-emitting diode display panel further includes voltage lines and scan lines, which are alternately disposed and stacked to form the RC compensation capacitor, wherein the concave area includes a first rounded corner area and a second rounded corner area opposite to the first rounded corner area, and the scan lines overlap the voltage lines after passing through the first rounded corner area and extend to the second rounded area.

The present invention provides an active matrix organic light-emitting diode display panel, including a display area having a recessed space and a concave area, wherein the concave area is connected to the display area and disposed close to the recessed space, the concave area is provided with an RC compensation capacitor, and the active matrix organic light-emitting diode display panel further includes voltage lines and scan lines, which are alternately disposed to form the RC compensation capacitor.

In the present invention, the voltage lines and the scan lines are stacked in the concave area, so that the voltage lines overlap the scan lines to form an RC compensation capacitor. Since the voltage lines generally have a voltage with a relatively stable DC signal, the RC compensation capacitor formed by the voltage lines and the scan lines can achieve the purpose of RC compensation. Meanwhile, compared with the prior art, by reusing a wiring space of the voltage lines, the wiring space of the narrow upper bezel can be effectively reduced, thereby realizing the design of the narrow upper bezel. Further, the RC compensation value of each of the rows can be adjusted by adjusting an overlapping area of the polysilicon layers of the scan lines and the voltage lines, thereby reducing the display difference.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Figure 1:
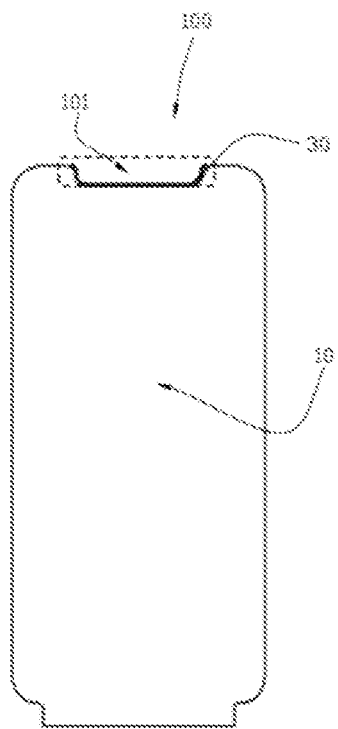
FIG. 1 is a schematic diagram of an overall structure of an active matrix organic light-emitting diode display panel according to an embodiment of the present invention.
Figure 2:
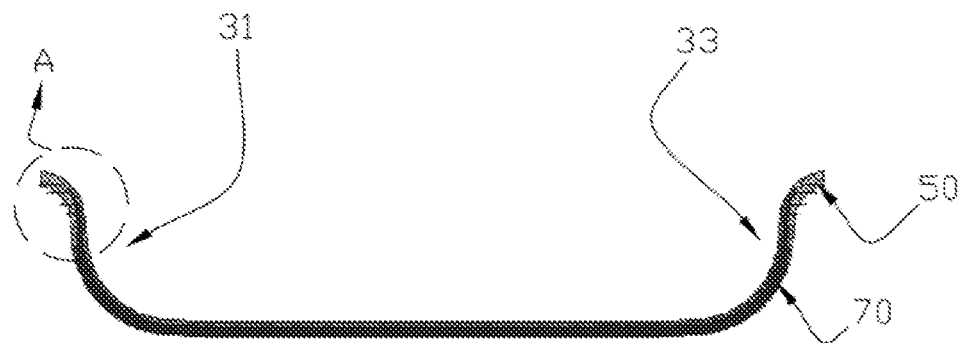
FIG. 2 is a schematic structural diagram of an RC compensation capacitor in a concave area of an active matrix organic light-emitting diode display panel according to an embodiment of the present invention.

Please refer to the figures in the drawings, in which, like numbers refer to like elements throughout the description of the figures. Hereinafter, the present invention will be described in further detail with reference to examples. It is to be understood, however, that these examples are for illustrative purposes only and are not intended to limit the scope of the present invention.

Directional terms mentioned in the present invention, such as up, down, top, bottom, front, back, left, right, inside, outside, side, peripheral, center, horizontal, horizontal, vertical, longitudinal, axial, radial, the uppermost layer, or the lowermost layer, etc., are merely directions with reference to the drawings. Therefore, the directional terms used are for explaining and understanding the present invention, but not for limiting the present invention. In addition, for structural elements with the same or similar characteristics, the present invention uses the same reference numerals for identification.

Referring to FIG. 1 to FIG. 4, an embodiment of the present invention provides an active matrix organic light-emitting diode display panel 100. The active matrix organic light-emitting diode display panel 100 includes a display area 10 provided with a recessed space 101, a concave area 30, and voltage lines 50 and scan lines 70 that are alternately disposed. The voltage lines 50 are, for example, voltage source supply lines (VSS line). The recessed space 101 is formed by notch-cutting the display area 10 of the active matrix organic light-emitting diode display panel 100. The concave area 30 is connected to the display area 10 and is disposed near the recessed space 101.

Specifically, the active matrix organic light-emitting diode display panel 100 has a rectangular shape, and the recessed space 101 is formed at one end of the active matrix organic light-emitting diode display panel 100 in a lengthwise direction. The concave area 30 has a shape the same as an outer contour of the recessed space 101. In other words, the concave area 30 surrounds the recessed space 101.

An resistor-capacitor (RC) compensation capacitor is disposed in the concave area 30, and the RC compensation capacitor is formed by the voltage lines 50 and the scan lines 70. Specifically, the voltage lines 50 and the scan lines 70 are stacked to form the RC compensation capacitor. In this way, because the voltage in the voltage lines 50 has a stable DC signal, the RC compensation capacitor formed by the voltage lines 50 and the scan lines 70 can achieve the purpose of RC compensation, greatly reducing the wiring space of the upper bezel, compared with the prior art, in which an RC compensation unit is added to each of the rows, such that the design of a narrow upper bezel is achieved.

The number of the scan lines 70 is plural, and the plurality of scan lines 70 are arranged in parallel and equally spaced. Meanwhile, the voltage lines 50 have a shape similar to the concave area 30, and are routed along edges of the concave area 30.

Specifically, the concave area 30 includes a first rounded corner area 31 and a second rounded corner area 33 opposite to the first rounded corner area 31. The scan lines 70 overlap the voltage lines 50 after passing through the first rounded corner area 31, and extend to the second rounded corner area 33.

Figure 4:
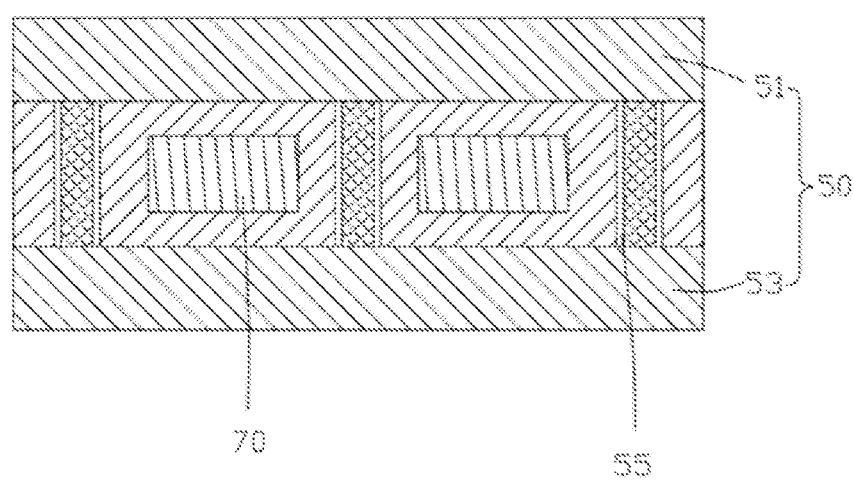
FIG. 4 is a schematic structural diagram of an RC compensation capacitor of an active matrix organic light-emitting diode display panel according to a preferred embodiment of the present invention.

Referring to FIG. 4, specifically, the voltage lines 50 include a metal layer 51 and a polysilicon layer 53 which are stacked on opposite sides of the scan lines 70 and are insulated from the scan lines 70, respectively, and the metal layer 51 is electrically connected to the polysilicon layer 53 through a via hole 55.

It should be noted that the number of the via holes 55 is not limited in the present invention, and may be multiple or only two, and it will be within the protection scope of the present invention as long as the purpose of electrically connecting the metal layer 51 to the polysilicon layer 53 can be achieved.

Specifically, in this embodiment, the number of the via holes 55 is plural, and the plurality of via holes 55 are distributed on opposite sides of the scan lines 70. In other embodiments, when the number of the via holes 55 is two, the two via holes 55 are respectively disposed on the upper side of the scan lines 70 in the first row and the lower side of the scan lines 70 in the last row in the concave area 30.

Preferably, in order to reduce the resistance value in the voltage lines 50, the metal layer 51 includes a titanium-aluminum-titanium laminated film composed of a titanium film, an aluminum film, and a titanium film, and the scan lines 70 is made of a material including molybdenum.

Figure 5:
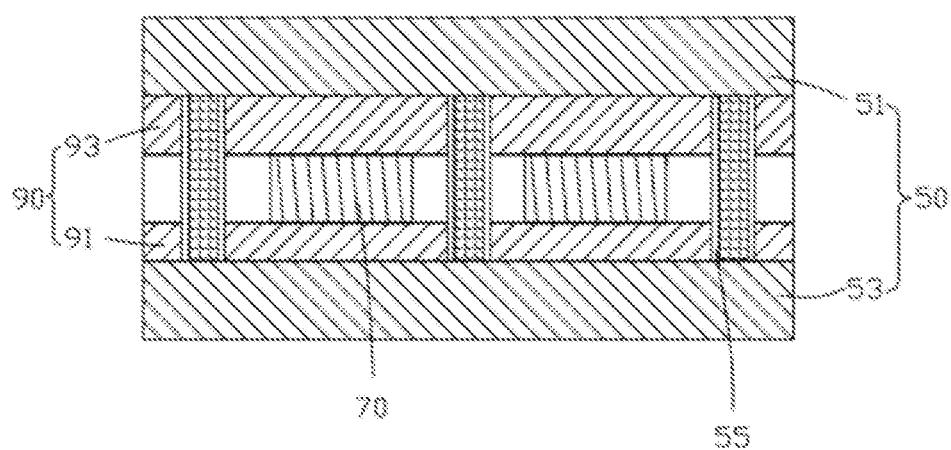
FIG. 5 is a schematic structural diagram of an RC compensation capacitor of an active matrix organic light-emitting diode display panel according to another preferred embodiment of the present invention.

Referring to FIG. 5, an insulating layer 90 is provided between the scan lines 70 and the voltage lines 50, and the scan lines 70 and the voltage lines 50 are spaced from each other by the insulating layer 90 to form the RC compensation capacitor. The insulating layer 90 includes a first insulating layer 91 provided between the scan lines 70 and the polysilicon layer 50 and a second insulating layer 92 provided between the scan lines 70 and the metal layer 51, and the first insulating layer 91 has a thickness smaller than the second insulating layer 92. Such an arrangement is beneficial to increase the capacitance generated when the scan lines 70 and the voltage lines 50 are stacked.

Meanwhile, the active matrix organic light-emitting diode display panel 100 provided in the embodiment of the present invention can also adjust the RC compensation value of each of the rows by adjusting an overlapping area between the scan lines 70 and the polysilicon layer 53, so as to achieve matching between scanning and loading of the entire concave area 30 and the display area 10, thus reducing the difference in display.

Specifically, a method of adjusting the RC compensation capacitor is as follows:

The scan lines 70 in the first row (for example, at an end far from the integrated circuit) has the largest RC compensation value, the largest overlap area with the alignment film layer 53, and the largest compensation capacitance, wherein with an increased in an order of a row, the overlap area is reduced gradually.

Figure 3:
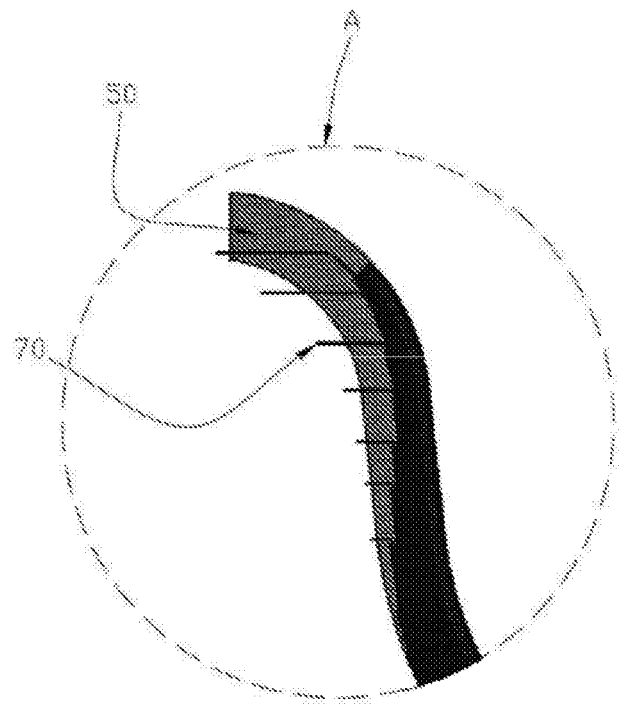
FIG. 3 is a schematic structural diagram of another RC compensation capacitor in a concave area of an active matrix organic light-emitting diode display panel according to an embodiment of the present invention.

Referring to FIG. 3, specifically, the magnitude of the compensation value is related to the missing pixels of the concave area 30. The specific RC compensation value can be obtained through circuit simulation, and the required RC compensation value in the last row is provided by the scan lines 70 corresponding to the last row, and the scan lines 70 in the display area 10 other than the recessed space 101 are not subjected to RC compensation.

For example, it is assumed that the horizontal resolution of the active matrix organic light-emitting diode display panel 100 is m, the total capacitance of a single pixel and the scan lines 70 is aF, the capacitance per unit area of the polysilicon layer 53 and the scan lines 70 is bF/cm2, the capacitance per unit area of the voltage lines 50 and the scan lines 70 is cF/cm2, and the number of missing pixels in a row of the concave area 30 is n, such that the overlapping area x between the polysilicon layer 53 and the scan lines 70 and the overlapping area y between the voltage lines 50 and the scan lines 70 should satisfy the following equation: x×b+y×c=n×a It should be noted that the "first row" refers to an end of the active matrix organic light-emitting diode display panel 100 near the recessed space 101. The first row to the last row are arranged along an end near the recessed space 101 to an end far from the recessed space 101.

Compared with the related art, in the active matrix organic light-emitting diode display panel according to an embodiment of the present invention, the voltage lines and the scan lines are stacked in the concave area, so that the voltage lines overlap the scan lines to form an RC compensation capacitor. Since the voltage lines generally have a voltage with a relatively stable DC signal, the RC compensation capacitor formed by the voltage lines and the scan lines can achieve the purpose of RC compensation. Meanwhile, compared with the prior art, by reusing a wiring space of the voltage lines, the wiring space of the narrow upper bezel can be effectively reduced, thereby realizing the design of the narrow upper bezel. Further, the RC compensation value of each of the rows can be adjusted by adjusting an overlapping area of the polysilicon layers of the scan lines and the voltage lines, thereby reducing the display difference.

What has been described above are only the embodiments of the present invention. It should be pointed out that, for those skilled in the art, improvements can be made without departing from the inventive concept of the present invention, but these all belong to the protection scope of the present invention.

What is claimed is:

1. An active matrix organic light-emitting diode display panel, comprising a display area having a recessed space and a concave area, wherein the concave area is connected to the display area and disposed close to the recessed space, the concave area is provided with an RC compensation capacitor, and the active matrix organic light-emitting diode display panel further comprises voltage lines and scan lines, which are alternately disposed and stacked to form the RC compensation capacitor, wherein:

the concave area comprises a first rounded corner area and a second rounded corner area opposite to the first rounded corner area, and the scan lines overlap the voltage lines after passing through the first rounded corner area and extend to the second rounded area; and the voltage lines comprise a metal layer and a polysilicon layer that are respectively stacked on opposite sides of the scan lines and are insulated from the scan lines, wherein the metal layer is electrically connected to the polysilicon layer through a via hole.

2. The active matrix organic light-emitting diode display panel according to claim 1, further comprising a plurality of via holes distributed on opposite sides of the scan lines.

3. The active matrix organic light-emitting diode display panel according to claim 1, wherein the metal layer comprises a titanium-aluminum-titanium stacked film consisting of a titanium layer, an aluminum layer, and a titanium layer.

4. The active matrix organic light-emitting diode display panel according to claim 1, wherein the scan lines are made of a material comprising molybdenum.

5. The active matrix organic light-emitting diode display panel according to claim 1, further comprising an insulating layer disposed between the scan lines and the voltage lines, wherein the scan lines and the voltage lines are spaced from each other by the insulating layer to form the RC compensation capacitor.

6. The active matrix organic light-emitting diode display panel according to claim 5, wherein the insulating layer comprises a first insulating layer disposed between the scan lines and the polysilicon layer and a second insulating layer disposed between the scan lines and the metal layer, and the first insulating layer has a thickness smaller than the second insulating layer.

7. The active matrix organic light-emitting diode display panel according to claim 1, wherein the scan lines are arranged in parallel and equally spaced.

8. An active matrix organic light-emitting diode display panel, comprising a display area having a recessed space and a concave area, wherein the concave area is connected to the display area and disposed close to the recessed space, the recessed area is provided with an RC compensation capacitor, and the active matrix organic light-emitting diode display panel further comprises voltage lines and scan lines, which are alternately disposed to form the RC compensation capacitor; and wherein the voltage lines comprise a metal layer and a polysilicon layer that are respectively stacked on opposite sides of the scan lines and are insulated from the scan lines, the metal layer is electrically connected to the polysilicon layer through a via hole.

9. The active matrix organic light-emitting diode display panel according to claim 8, wherein the voltage lines and the scan lines are stacked to form the RC compensation capacitor.

10. The active matrix organic light-emitting diode display panel according to claim 8, wherein the concave area comprises a first rounded corner area and a second rounded corner area opposite to the first rounded corner area, and the scan lines overlap the voltage lines after passing through the first rounded corner area and extend to the second rounded area.

11. The active matrix organic light-emitting diode display panel according to claim 8, further comprising a plurality of via holes distributed on opposite sides of the scan lines.

12. The active matrix organic light-emitting diode display panel according to claim 8, wherein the metal layer comprises a titanium-aluminum-titanium stacked film consisting of a titanium layer, an aluminum layer, and a titanium layer.

13. The active matrix organic light-emitting diode display panel according to claim 8, wherein the scan lines are made of a material comprising molybdenum.

14. The active matrix organic light-emitting diode display panel according to claim 8, further comprising an insulating layer disposed between the scan lines and the voltage lines, wherein the scan lines and the voltage lines are spaced from each other by the insulating layer to form the RC compensation capacitor.

15. The active matrix organic light-emitting diode display panel according to claim 14, wherein the insulating layer comprises a first insulating layer disposed between the scan lines and the polysilicon layer and a second insulating layer disposed between the scan lines and the metal layer, and the first insulating layer has a thickness smaller than the second insulating layer.

16. The active matrix organic light-emitting diode display panel according to claim 8, wherein the scan lines are arranged in parallel and equally spaced.

* * * * *

UNITED STATES PATENT AND TRADEMARK OFFICE
CERTIFICATE OF CORRECTION

PATENT NO. : 11,393,890 B2
APPLICATION NO. : 16/770831
DATED : July 19, 2022
INVENTOR(S) : Tao Chen It is certified that error appears in the above-identified patent and that said Letters Patent is hereby corrected as shown below:

On the Title Page

Please correct the assignee name to: WUHAN CHINA STAR OPTOELECTRONICS SEMICONDUCTOR DISPLAY TECHNOLOGY CO., LTD.

Signed and Sealed this
Twenty-third Day of May, 2023

Katherine Kelly Vidal
*Director of the United States Patent and Trademark Office*